United States Patent
Matsumoto (10) Patent No.: US 9,947,509 B2
(45) Date of Patent: Apr. 17, 2018

(54) MULTIPLE CHARGED PARTICLE BEAM LITHOGRAPHY APPARATUS AND MULTIPLE CHARGED PARTICLE BEAM LITHOGRAPHY METHOD

(71) Applicant: NuFlare Technology, Inc., Yokohama-shi (JP)

(72) Inventor: Hironobu Matsumoto, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 15/142,076

(22) Filed: Apr. 29, 2016

(65) Prior Publication Data
US 2016/0349626 A1    Dec. 1, 2016

(30) Foreign Application Priority Data
May 27, 2015    (JP) .................................. 2015-107561

(51) Int. Cl.
G03B 27/68    (2006.01)
H01J 37/317    (2006.01)

(52) U.S. Cl.
CPC ................................ H01J 37/3174 (2013.01)

(58) Field of Classification Search
CPC .... G03F 7/70558; G03F 1/20; G03F 7/70508; G03F 7/70716; G03F 7/70775; H01L 21/0274
See application file for complete search history.

(56) References Cited

U.S. PATENT DOCUMENTS

| | | | |
|---|---|---|---|
| 6,870,171 B2 * | 3/2005 | Hosoda .................. | B82Y 10/00 250/396 ML |
| 7,705,327 B2 | 4/2010 | Horiuchi et al. | |
| 8,178,856 B2 * | 5/2012 | Nakayamada ......... | B82Y 10/00 250/252.1 |

(Continued)

FOREIGN PATENT DOCUMENTS

| JP | 62-34134 | 7/1987 |
|---|---|---|
| JP | 5-21323 | 1/1993 |

(Continued)

OTHER PUBLICATIONS

Office Action dated May 29, 2017 in Korean Patent Application 10-2016-0064777 (with English translation).

Primary Examiner — Deoram Persaud
(74) Attorney, Agent, or Firm — Oblon, McClelland, Maier & Neustadt, L.L.P.

(57) ABSTRACT

According to one aspect of the present invention, a multiple charged particle beam lithography apparatus includes a circuitry configured to divide a lithography region of a target object into a plurality of pixel regions having a mesh shape and being irradiated with multiple charged particle beams; a circuitry configured to group the plurality of pixel regions into a plurality of pixel blocks configured with at least one pixel region; a circuitry configured to correct position deviation in unit of a pixel block for each pixel block of the plurality of pixel blocks; a dose calculating processing circuitry configured to calculate a dose being irradiated on the pixel concerned for each pixel where the position deviation is corrected; and a mechanism configured to write a pattern on the target object by using the multiple charged particle beams so that each pixel is illuminated with the calculated dose.

10 Claims, 9 Drawing Sheets

(56) References Cited

U.S. PATENT DOCUMENTS

| | | | |
|---|---|---|---|
| 8,563,953 B2* | 10/2013 | Nakayamada | B82Y 10/00 250/396 R |
| 8,729,507 B2 | 5/2014 | Yoshikawa et al. | |
| 2003/0189181 A1 | 10/2003 | Ohta et al. | |
| 2008/0130982 A1* | 6/2008 | Kitamura | G06K 9/00 382/144 |
| 2009/0242807 A1* | 10/2009 | Tsuruta | B82Y 10/00 250/492.2 |
| 2010/0264309 A1* | 10/2010 | Hirose | H01J 37/21 250/310 |
| 2011/0049344 A1* | 3/2011 | Dobashi | H01J 37/222 250/252.1 |
| 2011/0253912 A1* | 10/2011 | Matsumoto | B82Y 10/00 250/492.22 |
| 2011/0297826 A1* | 12/2011 | Madokoro | H01J 37/153 250/307 |
| 2013/0056645 A1* | 3/2013 | Yoshikawa | H01J 37/305 250/396 R |
| 2013/0056647 A1* | 3/2013 | Yoshikawa | H01J 37/3026 250/400 |

FOREIGN PATENT DOCUMENTS

| | | |
|---|---|---|
| JP | 6-84768 | 3/1994 |
| JP | 2003-297732 | 10/2003 |
| JP | 2008-85120 | 4/2008 |
| JP | 2014-7379 | 1/2014 |
| KR | 10-2013-0135772 | 12/2013 |

\* cited by examiner

MULTIPLE CHARGED PARTICLE BEAM LITHOGRAPHY APPARATUS AND MULTIPLE CHARGED PARTICLE BEAM LITHOGRAPHY METHOD

CROSS-REFERENCE TO RELATED APPLICATION

This application is based upon and claims the benefit of priority from prior Japanese Patent Application No. 2015-107561 filed on May 27, 2015 in Japan, the entire contents of which are incorporated herein by reference.

BACKGROUND OF THE INVENTION

Field of the Invention

The present invention relates to a multiple charged particle beam lithography apparatus and a multiple charged particle beam lithography method, and relates to a multiple beam lithography apparatus and method which performs correction of position deviation caused by, for example, distortion of a stage and distortion of a mirror for position measurement.

Related Art

Lithography technique facilitating development of miniaturization of semiconductor devices is a very important process of generating a unique pattern in semiconductor manufacturing processes. In recent years, with high integration of LSIs, line widths of circuits required for semiconductor devices have been miniaturized year after year. In order to form a desired circuit pattern on the semiconductor devices, a highly-accurate master pattern (also called a reticle or a mask) is required. Herein, since an electron beam (EB) lithography technique has an essentially excellent resolution, the EB lithography technique is used to produce a highly-accurate master pattern.

For example, there is a lithography apparatus using one beam. For example, there is a raster-type lithography apparatus. In the raster-type lithography apparatus, for example, one beam is formed from an electron beam emitted from an electron gun assembly through a mask having one hole, and blanking control is performed so that necessary sites are irradiated with the beam while the one shaped beam is deflected by a deflector so as to perform sequential tracing on a target object.

Besides, for example, there is a lithography apparatus using multiple beams. In comparison with the case of lithographing with one electron beam, many beams can be irradiated at one time by using the multiple beams, and thus, the throughput can be greatly improved. In the multiple beam type lithography apparatus, for example, the multiple beams are formed from an electron beam emitted from an electron gun assembly through a mask having a plurality of holes; and with respect to each of the multiple beams, blanking control is performed, each beam which is not blocked is reduced by an optical system, is deflected by a deflector, and is irradiated on a desired position on a target object.

In a lithography apparatus including multiple beam lithography, there is a case of using a laser measurement device at the time of measuring a position of a stage. In the laser measurement device, there is a problem in that error occurs in the measured position due to distortion of a reflecting surface of a mirror disposed on the stage. If distortion occurs in the target object surface which is set as a lithography object, there is a problem in that error occurs in a lithographing position. In the related art, for example, a vector-type single-beam lithography apparatus such as a variable shaping type lithography apparatus, since a coordinate system of the lithography apparatus is corrected into an ideal coordinate system, the entire surface of a to-be-lithographed target object is divided in a mesh shape with predetermined grid dimensions, and a position of the vertex of each mesh is measured. The coordinate system of the lithography apparatus is corrected from an error between the measured position and the design position (this function is called a "grid matching collection (GMC)" function. Hereafter, correction by this function is called GMC correction). More specifically, a pattern for GMC measurement is lithographed at positions corresponding to the positions of the vertexes of the meshes in a mask blank applied with resist. By performing processes such as development and etching on the mask, a position accuracy from the lithographed pattern is measured. The coordinate system of the lithography apparatus is corrected from the obtained result (for example, refer to JP-A-2008-085120). In the GMC correction, the position correction is performed for every shot after shot data are generated.

On the other hand, in the multiple beam lithography type, since many beams are irradiated at one time and the entire multiple beams are deflected collectively even in case of deflecting the beams, it is difficult to correct the positions of the individual beams. In order to correct the positions, there is a method of transforming a pattern shape so as to be fitted to a bit (pixel) pattern, calculating a dose of each pixel, and performing dose such as distributing the dose of the pixel of interest to adjacent pixels. However, in this method, since the dose of the pixel located at an end of the pattern is distributed to surrounding pixels, the steepness of slope of a beam profile disappears (becomes small). As a result, there is a problem in that the resolution is deteriorated. If the resolution is deteriorated, accuracy in lithography position and line width of the pattern is deteriorated.

As described above, in the multiple beam lithography, it is difficult to individually correct position deviations caused by distortion of the reflecting surface of the mirror on the stage and/or the distortion on the target object surface which is set to as the lithography object. As a result, it is difficult to sufficiently correct the position deviations.

BRIEF SUMMARY OF THE INVENTION

According to one aspect of the present invention, a multiple charged particle beam lithography apparatus includes a dividing processing circuitry configured to divide a lithography region of a target object into a plurality of pixel regions having a mesh shape and being irradiated with multiple charged particle beams; a group processing circuitry configured to group the plurality of pixel regions into a plurality of pixel blocks configured with at least one pixel region; a correction processing circuitry configured to correct position deviation in unit of a pixel block for each pixel block of the plurality of pixel blocks; a dose calculating processing circuitry configured to calculate a dose being irradiated on the pixel concerned for each pixel where the position deviation is corrected; and a lithography mechanism including a charged particle beam source, a deflector, and a stage on which the target object is placed and configured to write a pattern on the target object by using the multiple charged particle beams so that each pixel is illuminated with the calculated dose.

According to another aspect of the present invention, a multiple charged particle beam lithography method includes dividing a lithography region of a target object into a plurality of pixel regions having a mesh shape and being irradiated with multiple charged particle beams; grouping the plurality of pixel regions into a plurality of pixel blocks configured with at least one pixel region; correcting position deviation in unit of a pixel block for each pixel block of the plurality of pixel blocks; calculating a dose being irradiated on the pixel for each pixel where the position deviation is corrected; and writing a pattern on the target object by using the multiple charged particle beams so that each pixel is illuminated with the calculated dose.

DETAILED DESCRIPTION OF THE INVENTION

First Embodiment

Hereinafter, in an embodiment, apparatus and method capable of correcting position deviation in multiple beam lithography caused by distortion of a reflecting surface of a mirror and/or distortion on a target object surface which is set as a lithography object.

Hereinafter, in the embodiment, a configuration where an electron beam is used as an example of a charged particle beam will be described. However, the charged particle beam is not limited to the electron beam, but beams using other charged particles such as ion beams may be available.

Figure 1:
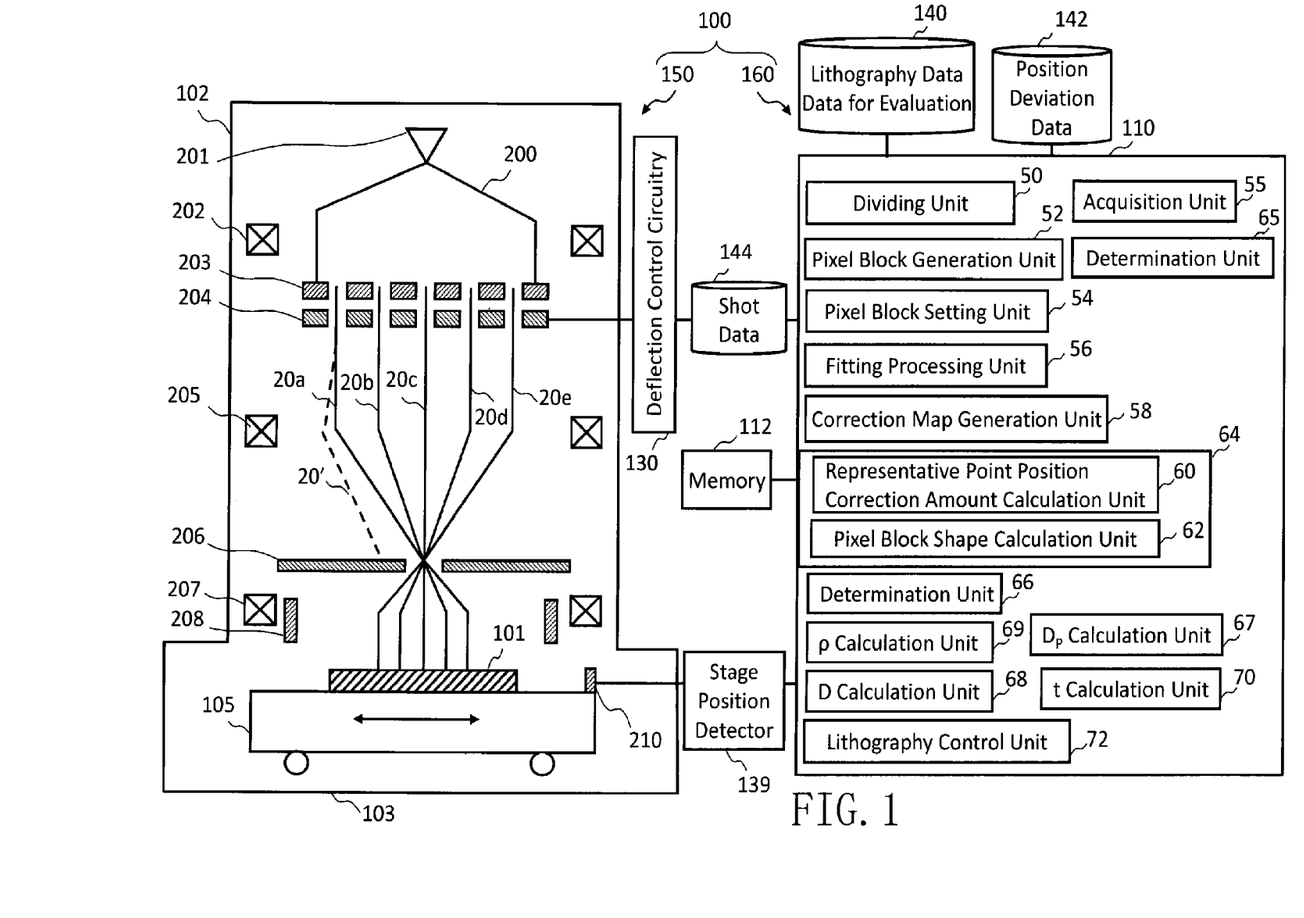
FIG. 1 is a conceptual diagram illustrating a configuration of a lithography apparatus according to a first embodiment.

FIG. 1 is a conceptual diagram illustrating a configuration of a lithography apparatus according to the first embodiment. In FIG. 1, the lithography apparatus 100 is configured to include a lithography mechanism 150 and a control unit 160 (control system circuit). The lithography apparatus 100 is an example of a multiple charged particle beam lithography (or "writing" or "drawing") apparatus. The lithography mechanism 150 is configured to include an electron optical column 102 and a lithography chamber 103. An electron gun assembly 201, an illumination lens 202, a shaping aperture array substrate 203, a blanking aperture array mechanism 204, a reduction lens 205, a limiting aperture member 206, an objective lens 207, and a deflector 208 are disposed in the electron optical column 102. An XY stage 105 is disposed (or "arranged") in the lithography chamber 103. A target object 101 such as a mask which is to be a lithography object substrate to be written in the lithography process is disposed on the XY stage 105. The target object 101 is retained on the XY stage 105, for example, by a three-point support (not shown). The target object 101 includes a mask for exposure in manufacturing a semiconductor device, a semiconductor substrate (silicon wafer) where a semiconductor device is to be manufactured, or the like. In addition, the target object 101 includes a mask blank where resist is applied and nothing is lithographed. A mirror 210 for position measurement of the XY stage 105 is disposed on the XY stage 105.

The control unit 160 is configured to include a control calculator 110, a memory 112, a deflection control circuit 130, a stage position detector 139, and storage devices 140, 142, and 144 such as magnetic disk drives. The control calculator 110, the memory 112, the deflection control circuit 130, the stage position detector 139, and the storage devices 140, 142, and 144 are connected to each other via a bus (not shown). Lithography data where pattern data of a plurality of shape patterns to be lithographed are defined are input from an outside of the lithography apparatus 100 to be stored in the storage device 140 (storage unit). Herein, as the lithography data, used are lithography data of an evaluation pattern for evaluating position deviation caused by, for example, distortion of a reflecting surface of the mirror 210 and/or distortion on a target object surface of the target object 101 which is set as the lithography object.

In addition, a dividing unit 50, a pixel block generation unit 52, a pixel block setting unit 54, an acquisition unit 55, a fitting processing unit 56, a correction map generation unit 58, a correction unit 64, a determination unit 65, a determination unit 66, a proximity effect correction dose coefficient ($D_p$) calculation unit 67, a dose (D) calculation unit 68, a ρ calculation unit 69, a beam irradiation time (t) calculation unit 70, and a lithography control unit 72 are disposed in the control calculator 110. The correction unit 64 is configured to include a representative point position correction amount calculation unit 60 and a pixel block shape calculation unit 62. In the dividing unit 50, the pixel block generation unit 52, the pixel block setting unit 54, the acquisition unit 55, the fitting processing unit 56, the correction map generation unit 58, the correction unit 64 (representative point position correction amount calculation unit 60, the pixel block shape calculation unit 62), the determination unit 65, the determination unit 66, the proximity effect correction dose coefficient ($D_p$) calculation unit 67, the dose (D) calculation unit 68, the ρ calculation unit 69, the beam irradiation time (t) calculation unit 70, and the lithography control unit 72, the term "unit" includes processing circuitry, and the processing circuitry includes an electric circuit, a computer, a processor, a circuit board, a quantum circuit, a semiconductor device, or the like. In addition, the term "unit" may also employ common processing circuitry (the same processing circuitry). Alternatively, the term "unit" may also use different processing circuitries (other processing circuitries). Input data necessary input in the control calculator 110 or calculation results in the control calculator 110 are stored in the memory 112 at every time of the input or the calculation.

Herein, in FIG. 1, a configuration necessary for explaining the first embodiment is illustrated. In the lithography apparatus 100, generally, a necessary configuration other than the configuration in FIG. 1 may be included.

Figure 2A:
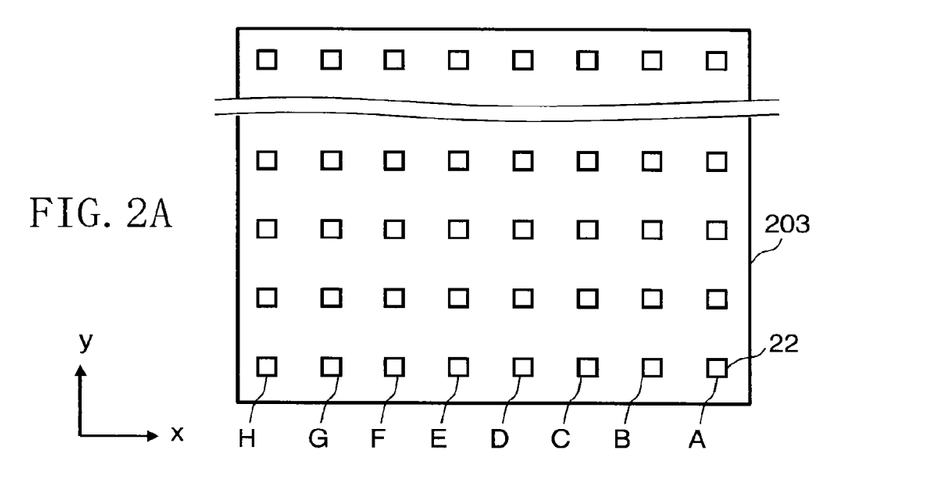
FIGS. 2A and 2B are conceptual diagrams illustrating a configuration of a shaping aperture array substrate according to the first embodiment.
Figure 2B:
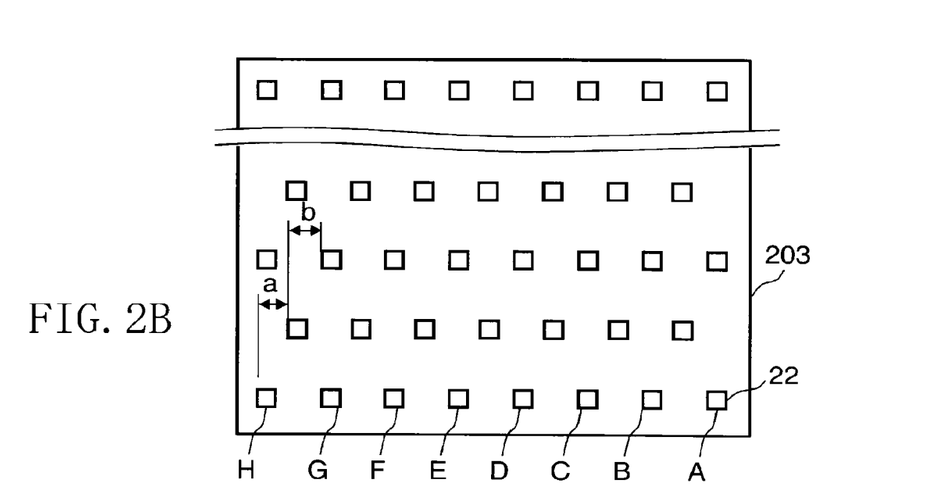

FIGS. 2A and 2B are conceptual diagrams illustrating a configuration of a shaping aperture array substrate according to the first embodiment. In FIG. 2A, in the shaping aperture array substrate 203 holes (openings) 22 of m rows long (y direction)×n columns wide (x direction) (m, n≥2) are formed in a matrix shape in a predetermined arrangement pitch. In FIG. 2A, for example, 512 rows×8 columns of the holes 22 are formed. The holes 22 are formed as rectangles having the same size and shape. Alternatively, the holes may also be formed as circles having the same diameter. Herein, illustrated is an example where eight holes 22 of A to H in the x direction are formed in each rows of the y direction. Each portion of the electron beam 600 passes through each of the holes 22, so that a multiple beam 20a-20e is formed. Herein, although illustrated is the example where two or more rows and columns of holes 22 are disposed in both of the wide and length directions (x and y directions), the present invention is not limited thereto. Besides, for example, a plurality of holes 22 may be formed in one direction of the wide and length directions (x and y directions), and one row or one column may be formed in the other direction. In addition, the arrangement method of the holes 22 is not limited to the case where the holes are disposed in a lattice shape in the wide and length directions as illustrated in FIG. 2A. As illustrated in FIG. 2B, for example, the holes of the row of the first stage and the holes of the row of the second stage in the length direction (y direction) may be disposed to be shifted by only a size "a" in the wide direction (x direction). Similarly, the holes of the row of the second stage and the holes of the row of the third stage in the length direction (y direction) may be disposed to be shifted by only a size b in the wide direction (x direction).

Figure 3:
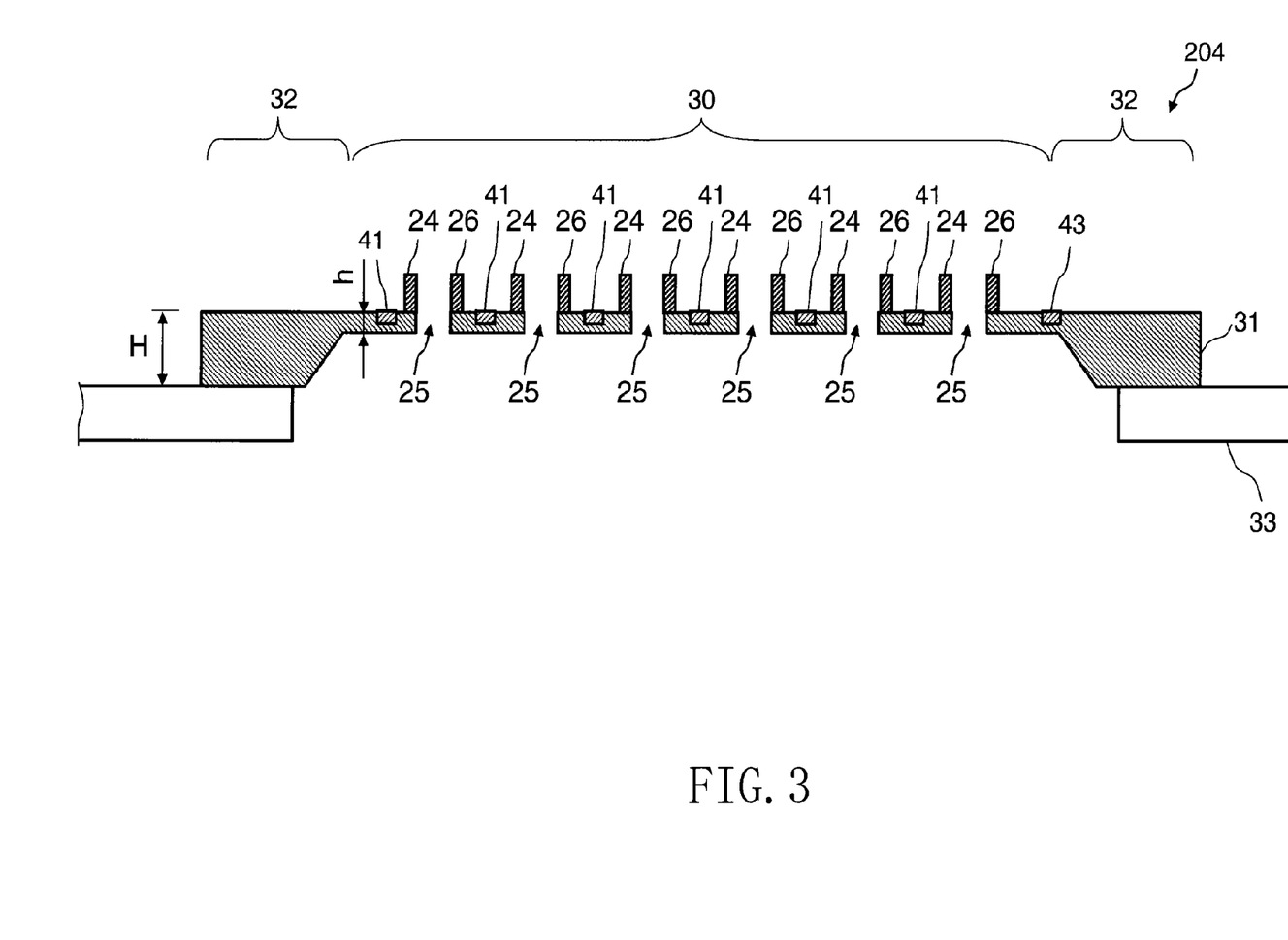
FIG. 3 is a cross-sectional diagram illustrating a configuration of a blanking aperture array mechanism according to the first embodiment.

FIG. 3 is a cross-sectional diagram illustrating a configuration of the blanking aperture array mechanism according to the first embodiment.

Figure 4:
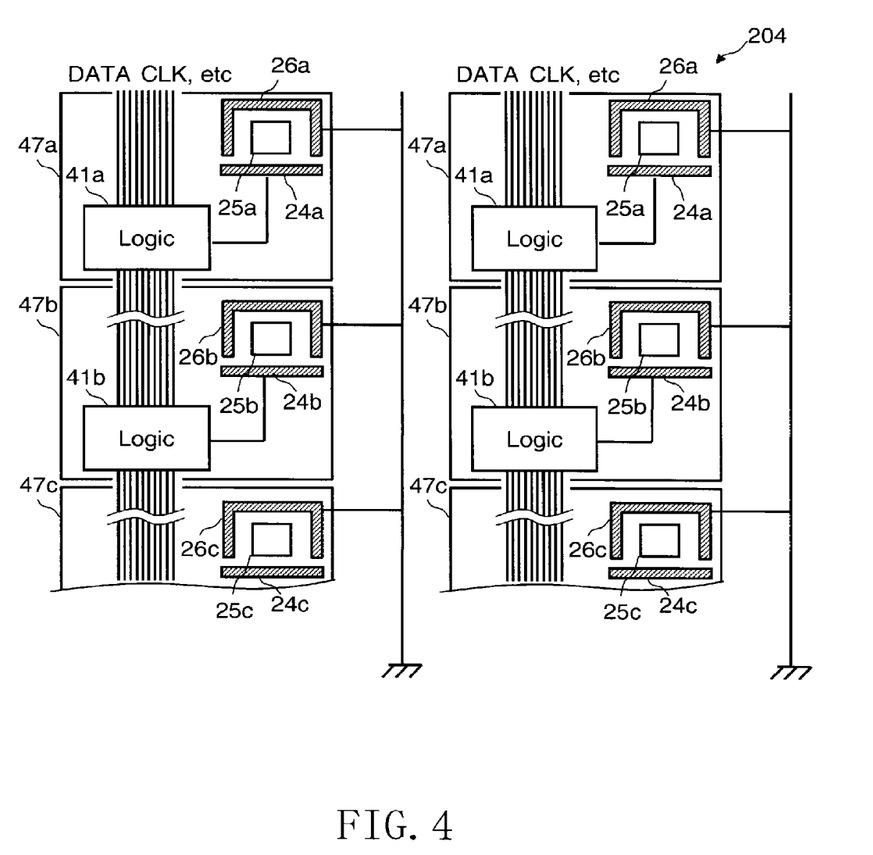
FIG. 4 is a conceptual plan diagram illustrating a portion of a configuration inside a membrane region of the blanking aperture array mechanism according to the first embodiment.

FIG. 4 is a conceptual plan diagram illustrating a portion of a configuration inside a membrane region of the blanking aperture array mechanism according to the first embodiment. In addition, in FIGS. 3 and 4, position relationships among the control electrode 24, the counter electrode 26, and the control circuits 41 and 43 are not illustrated to be coincident with each other. As illustrated in FIG. 3, in the blanking aperture array mechanism 204, a semiconductor substrate 31 made of silicon or the like is disposed on a support base 33. In the central portion of the substrate 31, a membrane region 30 (first region) having a small thickness h is formed, for example, by shaving the central portion from the rear surface side. The perimeter surrounding the membrane region 30 becomes an outer peripheral region 32 (second region) having a large thickness H. The top surface of the membrane region 30 and the top surface of the outer peripheral region 32 are formed so as to be at the same height position or at substantially the same height position. The substrate 31 is retained on the support base 33 by the rear surface of the outer peripheral region 32. The central portion of the support base 33 is opened, and the membrane region 30 is located in the opened region of the support base 33.

In the membrane region 30, through-holes 25 (openings) for transmitting the respective beams of the multiple beam are opened at positions corresponding to the respective holes 22 of the shaping aperture array substrate 203 illustrated in FIG. 2A (or FIG. 2B). As illustrated in FIGS. 3 and 4, on the membrane region 30, at the position in the vicinity of each of the through-holes 25, each set (blanker: blanking deflector) of the control electrode 24 for blanking deflection and the counter electrode 26 is disposed to interpose the corresponding through-hole 25. In addition, in the vicinity of each of the through-holes 25 on the membrane region 30, disposed is each control circuit 41 (logic circuit) which applies a deflection voltage to the control electrode 24 of each of the through-holes 25. The counter electrode 26 for each beam is grounded.

In addition, as illustrated in FIG. 4, each control circuit 41 is connected to, for example, 10-bit parallel wire lines for control signals. Each control circuit 41 is connected to a clock signal line and a power supply wire line besides the 10-bit parallel wire lines for control signals. The clock signal line and the power supply wire line may employ a portion of the parallel wire lines. For every beam constituting the multiple beams, an individual blanking mechanism 47 is configured with the control electrode 24, the counter electrode 26, and the control circuit 41. In addition, in the example of FIG. 3, the control electrode 24, the counter electrode 26, and the control circuit 41 are disposed in the membrane region 30 having a small thickness of the substrate 31. However, the present invention is not limited thereto.

The electron beam passing through each of the through-holes 25 is independently deflected by a voltage applied to a pair of two electrodes 24 and 26. The blanking control is performed by such deflection. In other words, each set of the control electrode 24 and the counter electrode 26 performs the blanking deflection on the corresponding beam among the multiple beam passing through a plurality of the holes 22 (openings) of the shaping aperture array substrate 203.

Operations of the lithography mechanism 150 in the lithography apparatus 100 will be described. The electron beam 200 emitted from the electron gun assembly 201 (emission unit) is illuminated on the entire shaping aperture array substrate 203 in the substantially perpendicular direction by the illumination lens 202. A plurality of the rectangular holes (openings) is formed in the shaping aperture array substrate 203, and the electron beam 200 illuminates the region including all the holes. For example, a plurality of quadrangular electron beams (multi-beams) 20a to 20e are formed by letting portions of the electron beam 200 which irradiate the positions of a plurality of holes individually pass through a corresponding hole of the plurality of holes of the shaping aperture array substrate 203. The multiple beams 20a to 20e pass through the respective corresponding blankers (first deflectors: individual blanking mechanisms) of the blanking aperture array mechanism 204. Each blanker deflects each of the electron beams 20a to 20e individually passing (performs the blanking deflection).

The multiple beams 20a to 20e passing through the blanking aperture array mechanism 204 are reduced by the reduction lens 205 and propagate toward a central hole formed in the limiting aperture member 206. Herein, the position of each of the electron beams 20' deflected by the blanker of the blanking aperture array mechanism 204 is shifted from the central hole of the limiting aperture member 206, so that the electron beam is blocked by the limiting aperture member 206. On the other hand, the electron beam 20a to 20e which is not deflected by the blanker of the blanking aperture array mechanism 204 passes through the central hole of the limiting aperture member 206 as illustrated in FIG. 1. By ON/OFF of the individual blanking mechanisms, the blanking control is performed, so that the ON/OFF of the beam is controlled. In this manner, the limiting aperture member 206 blocks each of the beams which are deflected so that the beams are in the beam OFF state by the individual blanking mechanisms. Therefore, for every beam, one shot of beam is formed by the beam which is formed from the time of the beam ON to the time of the beam OFF and passes through the limiting aperture member 206. The multiple beams 20a-20e passing through the limiting aperture member 206 are focused by the objective lens 207, so that a pattern image with a desired reduction ratio is formed. The beams (all the multiple beams) passing through the limiting aperture member 206 are collectively deflected in the same direction by the deflector 208 to be irradiated on the respective irradiation positions of the beams on the target object 101. In addition, for example, when the XY stage 105 is continuously moved, the beams are controlled by the deflector 208 so that the irradiation positions of the beams follows (tracks) the movement of the XY stage 105. The position of the XY stage 105 is measured by irradiating the mirror 210 on the XY stage 105 with a laser from the stage position detector 139 and using the reflected light. The multiple beams 20a-20e to be irradiated at one time are ideally aligned in a pitch obtained by multiplying an arrangement pitch of the plurality of holes of the shaping aperture array substrate 203 with the above-described desired reduction ratio. The lithography apparatus 100 performs a lithography operation of irradiating the multiple beams which become a shot beam according to the lithography sequence controlled by the lithography control unit 72 pixel by pixel according to the movement of the beam deflection position by the deflector 208, while following the movement of the XY stage 105 during each time of the tracking operation. When a desired pattern is lithographed, necessary beams according to the pattern are controlled to be in the beam ON state by the blanking control.

Figure 5:
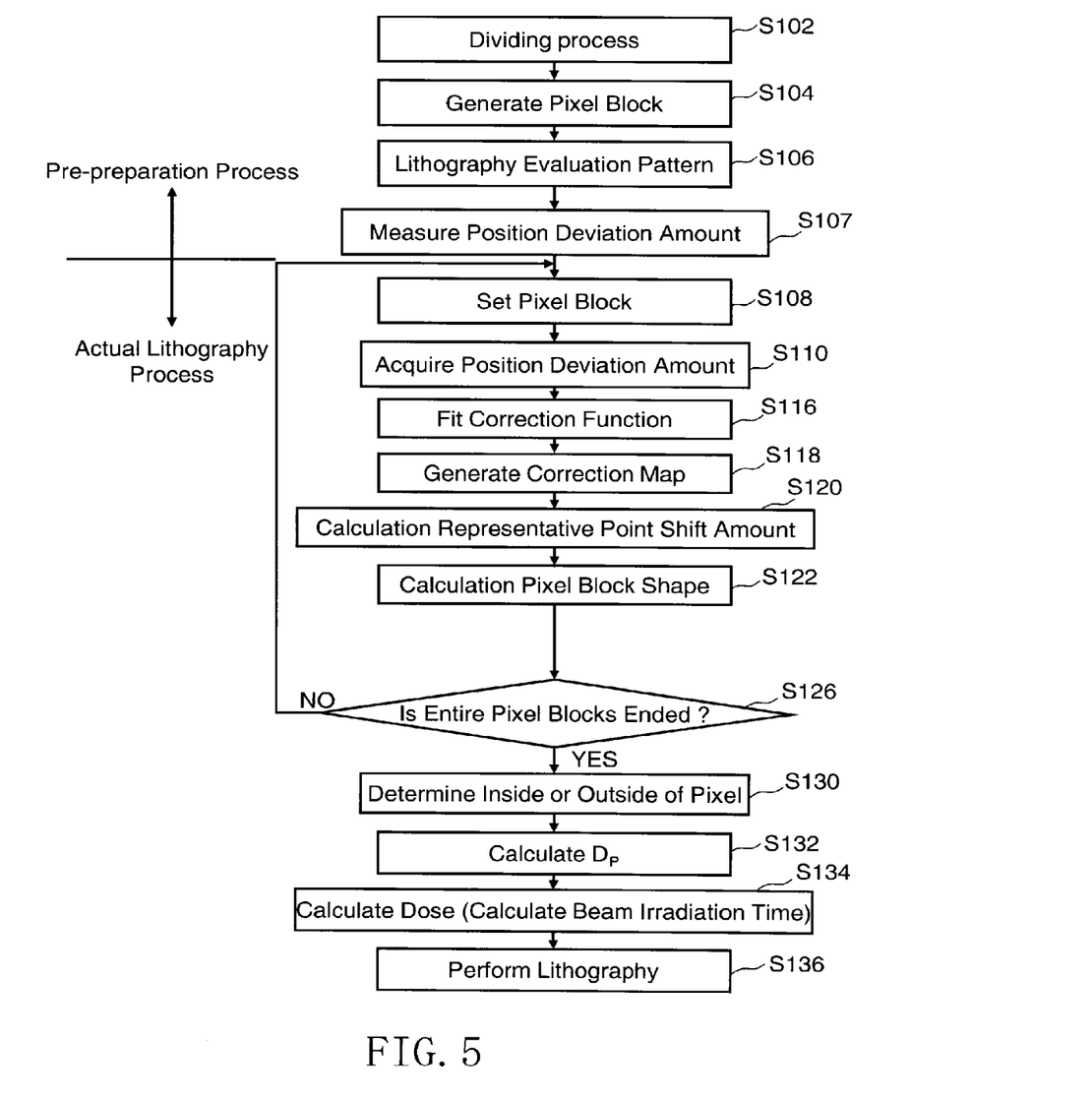
FIG. 5 is a flowchart illustrating main processes of a lithography method according to the first embodiment.

FIG. 5 is a flowchart illustrating main processes of a lithography method according to the first embodiment. In FIG. 5, in the lithography method according to the first embodiment, performed is a series of processes of a dividing process (S102), a pixel block generating process (S104), an evaluation pattern lithographing process (S106), a position deviation amount measuring process (S107), a pixel block setting process (S108), a position deviation amount measuring process (S110), a correction function fitting process (S116), a correction map generating process (S118), a representative point position correction amount calculating process (S120), a pixel block shape calculating process (S122), a determining process (S126), a pattern area density (□) calculating process (S130), a proximity effect correction dose coefficient (Dp) calculating process (S132), a dose (D) calculating/beam irradiation time calculating process (S134), and a lithographing process (S136).

Among the group of the processes, as pre-preparation processes of the lithography process for the target object 101 which is to be an actual product, performed are a dividing process (S102), a pixel block generating process (S104), an evaluation pattern lithographing process (S106), a position deviation amount measuring process (S107). After the above-described pre-preparation processes, as the actual lithography process, performed are a pixel block setting process (S108), a position deviation amount acquiring process (S110), a correction function fitting process (S116), a correction map generating process (S118), a representative point position correction amount calculating process (S120), a pixel block shape calculating process (S122), a determining process (S126), a pixel inside/outside determining process (S130), a proximity effect correction dose coefficient Dp calculating process (S132), a dose (D) calculating/beam irradiation time calculating process (S134), and a lithographing process (S136).

As the dividing process (S102), the dividing unit 50 divides the lithography region of the target object 101 into a plurality of pixel regions in a mesh shape which is irradiated with the multiple beam 20.

Figure 6:
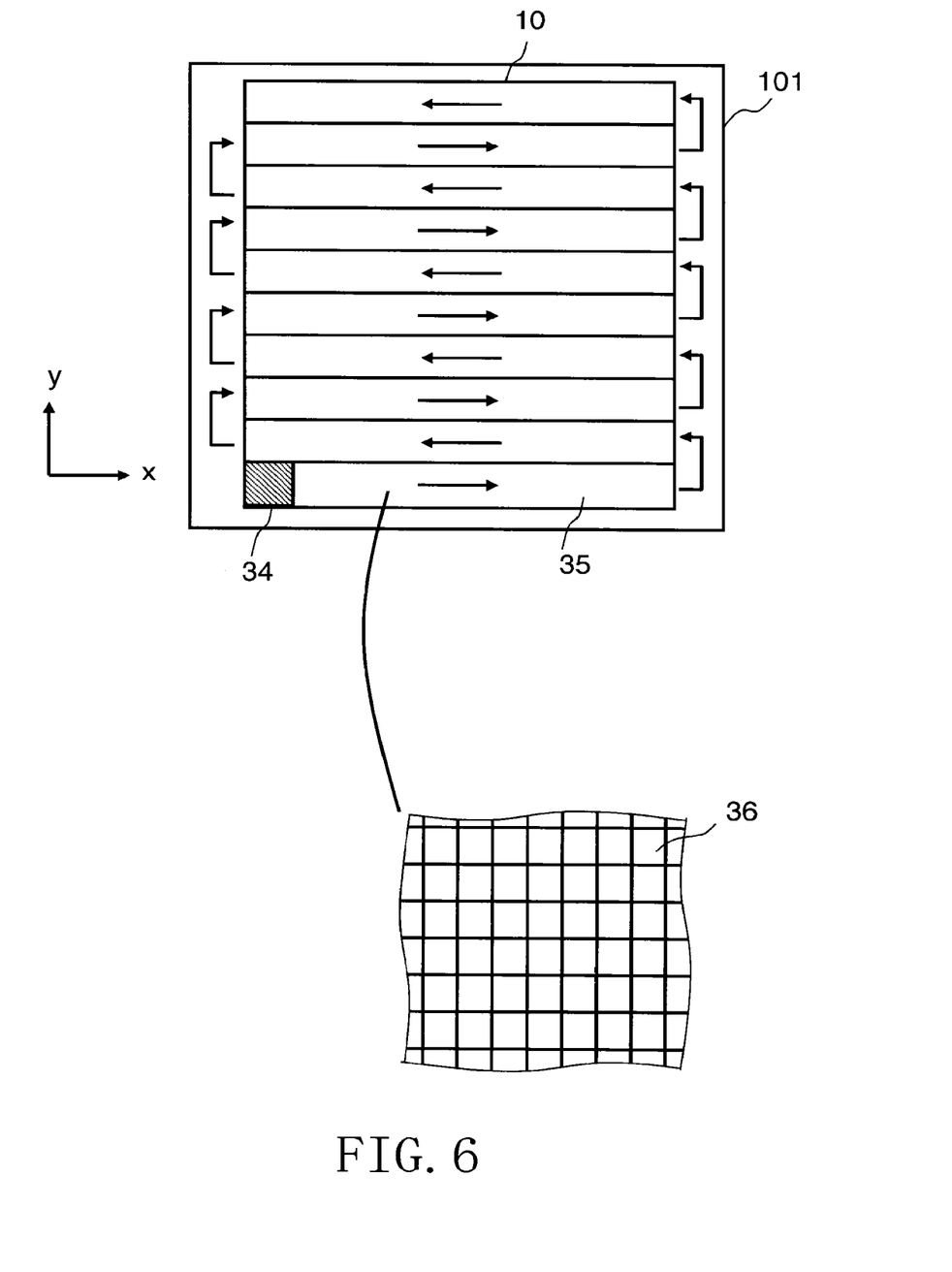
FIG. 6 is a diagram for explaining a lithography sequence in the first embodiment.

FIG. 6 is a diagram for explaining the lithography sequence in the first embodiment. The lithography region 10 (or the to-be-lithographed chip region) of the target object 101 is divided into stripe regions 35 (other example of the lithography region) having a strip with a predetermined width. The dividing unit 50 divides each stripe region 35 into pixel regions 36 (pixels) having a plurality of mesh shapes. A very appropriate size of the pixel region 36 (pixel) is, for example, the beam size or less. For example, a size of about 10 nm is very appropriate. The pixel region 36 (pixel) is an irradiation unit region in the vicinity of one beam of the multiple beams.

When the target object 101 is lithographed by the multiple beams 20, an irradiation region 34 is irradiated by the one-time irradiation of the multiple beams 20. As described above, while following the movement of the XY stage 105 in the tracking operation, the entire multiple beams 20 which are to be a shot beam are sequentially continuously irradiated, for example, pixel by pixel by the movement of the beam deflection position by the deflector 208. It is defined by the lithography sequence which pixel on the target object 101 which beam of the multiple beams is irradiated on. By using beam pitches between the beams which are adjacent to each other in the x and y directions of the multiple beams, the region of the beam pitch (x direction)×the beam pitch (y direction) between the beams which are adjacent to each other in the x and y direction on the surface of the target object 101 is configured with a region (sub pitch region) of n×n pixels. For example, in the case where the XY stage 105 is moved in the −x direction only by the beam pitch (x direction) by one-time tracking operation, the n pixels are lithographed while the irradiation position is shifted in the x direction or the y direction (or an inclined direction) by one beam. Similarly, with respect to other n pixels in the same region of the n×n pixels, the n pixels are lithographed by a beam different form the above-described beam in the next tracking operation. In this manner, by n times of the tracking operation, the lithographing is performed n-pixel by n-pixel by each of the different beams, so that all the pixels in the one region of the n×n pixels are lithographed. At the same time, the same operation is performed on the different regions of the n×n pixels in the irradiation region of the multiple beams, the lithographing is performed in the same manner. Due to such an operation, the entire pixels in the irradiation region 34 can be lithographed. By repeating such an operation, the entire corresponding stripe region 35 can be lithographed. Therefore, in the lithography apparatus 100, a desired pattern can be lithographed by a combination of the pixel patterns (bit patterns) which are formed by irradiating necessary pixels with the beams of necessary doses.

As the pixel block generating process (S104), the pixel block generation unit 52 groups a plurality of the pixel regions 36 into a plurality of pixel blocks configured with at least one pixel region 36. The pixel block generation unit 52 is an example of a group processing unit.

Figure 7:
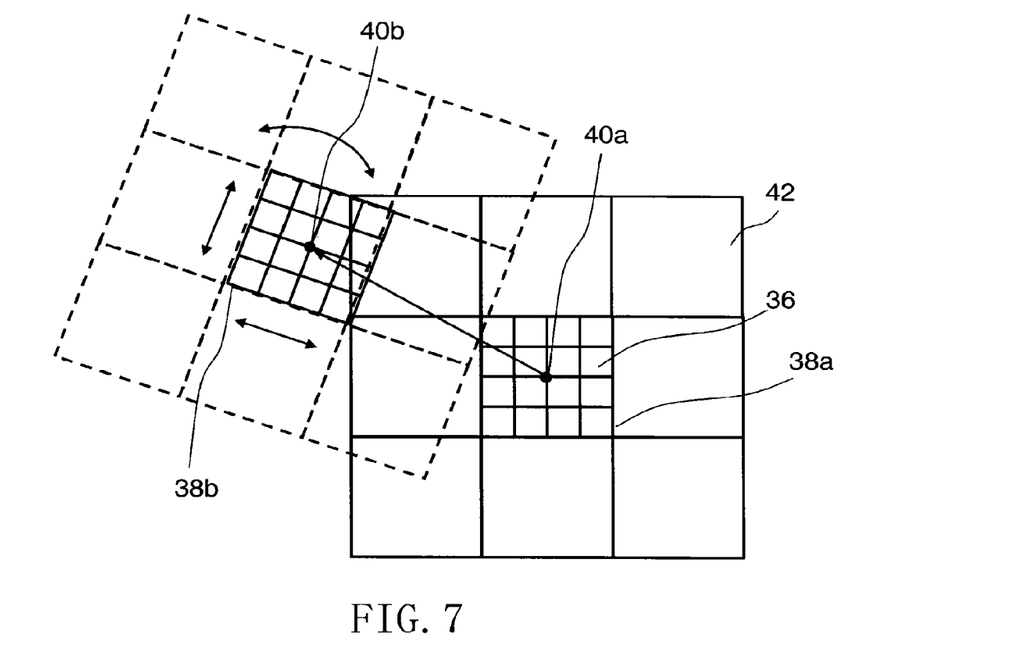
FIG. 7 is a diagram illustrating an example of a pixel block according to the first embodiment and an example of a state that the pixel block is corrected.

FIG. 7 is a diagram illustrating an example of the pixel block according to the first embodiment and an example of a state that the pixel block is corrected. In the example of FIG. 7, illustrated is an example where a 4×4 pixel region 36 group having four columns in the x direction and four stages in the y direction is defined as one pixel block 38 (42).

Herein, as described above, the target object 101 is retained on the XY stage 105, for example, by the three-point support (not shown). Such a target object supporting method causes the target object 101 to be bent due to its weight according to the distance from the supporting point. Therefore, a projection image of the electron beam is distorted on the target object surface, so that deviation occurs in the lithographing position (exposing position). In addition, distortion occurs on a reflecting surface of a mirror 210 for position measurement on the XY stage 105. Therefore, deviation occurs in the measured position of the stage. As a result, the deviation occurs in the lithographing position (exposing position). In the first embodiment, in the multiple beam lithography, the position deviation caused by the distortion of the reflecting surface of the mirror 210 and/or the distortion on the target object surface of the target object 101 which is set as the lithography object is corrected. More specifically, in the first embodiment, for every pixel block (42), the position and the shape of the region on the lithography data where the pixel block 38 (42) is set as the processing object are corrected. With respect to the number of pixels constituting the pixel block 38 (42), although at least one pixel region 36 may be available, a large amount of calculation time is needed to correct all the pixel region 36 in the calculation for every one of the pixels. Therefore, a configuration of several pixel groups is very preferred. For example, if the 4×4 pixel region 36 group is defined as one pixel block 38 (42), the calculation amount can be reduced by 1/16 in comparison with the calculation for every one of the pixels. On the contrary, if there are too many constituent pixels, the correction depending on the position is difficult to perform. Therefore, it is very preferable that the width size of the pixel block 38 (42) is set to, for example, the width size or less of the short side of the stripe region 35. In addition, in the example of FIG. 7, although all the pixel blocks 38 (42) are the same squares and are configured with adjacent 4×4 pixel region 36 groups, the present invention is not limited thereto. The number of constituent pixels or the shape of the pixel block 38 (42) may be different according to the pixel block 38 (42).

As the evaluation pattern lithographing process (S106), under the control of the lithography control unit 72, the lithography mechanism 150 writes (or "lithographs") an evaluation pattern on the target object 101. First, the p calculation unit 69 reads lithography data (data for evaluation) for the evaluation pattern from the storage device 140 and calculates a pattern area density ρ for every pixel region 36.

The $D_p$ calculation unit 67 virtually divides the lithography region (herein, for example, the stripe region 35) into a plurality of proximity mesh regions in a mesh shape with a predetermined size. It is very preferable that the size of the proximity mesh region is set to about 1/10 of a range of influence of the proximity effect, for example, about 1 μm. A correction dose coefficient $D_p(x)$ for correcting the proximity effect is calculated for every proximity mesh region. A correction model for the correction dose coefficient $D_p(x)$ and a calculation method thereof may be the same as those in the related art.

The dose (D) calculation unit 68 calculates the dose $D(x)$ by multiplying the obtained correction dose coefficient $D_p(x)$, the area density (ρ, and base doses of the beam $D_0$ for every pixel region 36. In this manner, it is very preferable that the dose $D(x)$ is calculated in proportion to the area density of the pattern calculated for every pixel region 36. The beam irradiation time (t) calculation unit 70 calculates the beam irradiation time t of the pixel by dividing the obtained dose $D(x)$ by the current density J for every pixel region 36. The beam irradiation time data obtained for every pixel are stored as shot data in the storage device 144 in the shot sequence.

The lithography mechanism 150 writes (or "lithographs") (exposes) the evaluation pattern on the evaluation target object 101 (evaluation substrate) by using the multiple beams so that each pixel corresponds to the calculated dose. The lithographed (exposed) evaluation target object 101 is developed, and a resist pattern is formed.

As the position deviation amount measuring process (S107), the position of the grid which becomes each evaluation position of the resist pattern is measured by a position measurement device (not shown), so that the lithographing position of each grid can be measured. In other words, a plurality of positions of the evaluation pattern lithographed on the evaluation substrate is measured. With respect to each evaluation grid, the position deviation amount of the corresponding measurement position from the design position of the evaluation pattern is calculated. The position deviation amount data are input from an outside of the lithography apparatus 100 to be stored in the storage device 142.

As the pixel block setting process (S108), the pixel block setting unit 54 sets one pixel block among the plurality of produced pixel blocks.

As the position deviation amount acquiring process (S110), the acquisition unit 55 reads the position deviation amount data stored in the storage device 142 to acquire the position deviation amount of each position in the set pixel block.

As the correction function fitting process (S116), the fitting processing unit 56 approximates (fits) the correction amount for correcting the position deviation of each position in the pixel block 38 by a correction function. In other words, coefficients of the correction function which is a polynomial expression are calculated. As an example of the correction function, for example, a 4th-order polynomial can be used. The 4th-order polynomial can be defined by the following Formulas (1-1), (1-2), (1-3), and (1-4). The correction amount $g_x(x, y)$ in the x direction is defined by Formula (1-1). The correction amount $g_y(x, y)$ in the y direction is defined by Formula (1-2). In addition, herein, the 1st-order term and other terms are separately expressed.

$$g_x(x,y) = g_{\Delta x}(x,y) + a_1 x + a_2 y \qquad (1\text{-}1)$$

$$g_y(x,y) = g_{\Delta y}(x,y) + b_1 x + b_2 y \qquad (1\text{-}2)$$

$$g_{\Delta x}(x,y) = a_0 + a_3 x^2 + a_4 xy + a_5 y^2 + a_6 x^3 + a_7 x^2 y + a_8 xy^2 + a_9 y^3 + a_{10} x^4 + a_{11} x^3 y + a_{12} x^2 y^2 + a_{13} xy^3 + a_{14} y^4 \qquad (1\text{-}3)$$

$$g_{\Delta y}(x,y) = b_0 + b_3 x^2 + b_4 xy + b_5 y^2 + b_6 x^3 + b_7 x^2 y + b_8 xy^2 + b_9 y^3 + b_{10} x^4 + b_{11} x^3 y + b_{12} x^2 y^2 + b_{13} xy^3 + b_{14} y^4 \qquad (1\text{-}4)$$

As the correction map generating process (S118), the correction map generation unit 58 generates a correction map where a correction amount ($G_x(x, y)$, $G_y(x, y)$) for uneven position deviation which cannot be corrected in the correction function is defined for every grid described above. It is favorable that the position correction amount ($G_x(x, y)$, $G_y(x, y)$) from the correction map at the position (x, y) employs an interpolation value of the correction amounts of four corners of the map grid corresponding to the position (x, y).

Therefore, the correction amount ($\delta_x$, $\delta_y$) of the pattern position deviation caused by the distortion of the reflecting surface of the mirror 210 and/or the distortion on the target object surface of the target object 101 which is set as the lithography object can be defined by the following Formula (2) in a matrix notation.

$$\begin{pmatrix} 1 \\ \delta_x \\ \delta_y \end{pmatrix} = \begin{pmatrix} 1 & 0 & 0 \\ g_{\Delta x}(x,y) + G_x(x,y) & a_1 & a_2 \\ g_{\Delta y}(x,y) + G_y(x,y) & b_1 & b_2 \end{pmatrix} \begin{pmatrix} 1 \\ x \\ y \end{pmatrix} \quad (2)$$

As described above, in the first embodiment, for every pixel block 42, the position and the shape of the region on the lithography data where the pixel block 38 of interest is set as the processing object are corrected. In other words, the correction unit 64 corrects the position deviation in unit of a pixel block for every pixel block among the plurality of pixel blocks. The correction unit 64 corrects the position of the representative point of the pixel block for every pixel block by using an inverse transformation amount of the correction function correcting the position deviation at the representative point of the pixel block. First, the position correction amount of the position correction at the representative point 40 of the pixel block 38 of interest is calculated.

As the representative point position correction amount calculating process (S120), the representative point position correction amount calculation unit 60 calculates the position correction amount of the representative point 40*a* of the pixel block 38*a* of interest for every pixel block 42 by using the inverse transformation amount of the correction function correcting the position deviation at the representative point 40 of the pixel block 38 of interest. As the position of the representative point 40*a*, for example, the center position of the pixel block 38*a* is very preferred. As described below, in some cases, in the shape of the region on the lithography data where the pixel block 38 is set as the processing object, distortion occurs according to the correction amount from the correction function Formulas (1-1) to (1-4) of the above-described position correction and the correction map. However, since this distortion is generally sufficient small, the same distortion as that of the representative point 40 occurs at the position in the vicinity of the representative point 40, the shape correction in the pixel block can be easily performed.

The inverse transformation formulas which inversely transforms the correction function expressed by Formulas (1-1) and (1-2) can be defined by the following Formulas (3-1) and (3-2).

$$g_x^{-1}(x,y) = k(g_{\Delta x}^{-1}(x,y) + b_2 x - b_1 y) \quad (3\text{-}1)$$

$$g_y^{-1}(x,y) = k(g_{\Delta y}^{-1}(x,y) - a_2 x + a_1 y) \quad (3\text{-}2)$$

In addition, the representative point position correction amount calculation unit 60 calculates a coefficient k which is to be used for Formulas (3-1) and (3-2). The coefficient k can be defined by the following Formula (4).

$$k = 1.0/\{1.0 + a_1)(1.0 \pm b_2) + b_1 a_2\} \quad (4)$$

In the calculation of Formulas (3-1) and (3-2), first, the representative point position correction amount calculation unit 60 (first calculation unit) calculates an inverse transformation term $g_{\Delta x}^{-1}(x, y)$ of the function $g_{\Delta x}(x, y)$ expressed by Formula (1-3) collecting the terms other than the 1st-order term and an inverse transformation term $g_{\Delta y}^{-1}(x, y)$ of the function $g_{\Delta y}(x, y)$ expressed by Formula (1-4) collecting the terms other than the 1st-order term which are used for the inverse transformation process for the correction function for every pixel block. The inverse transformation term $g_{\Delta x}^{-1}(x, y)$ and the inverse transformation term $g_{\Delta y}^{-1}(x, y)$ can be defined by the following Formulas (5-1) and (5-2).

$$g_{\Delta x}^{-1}(x,y) = a_2(g_{\Delta y}(x,y) + G_y(i,j)) - (a_0 + G_x(i,j))(1.0 + b_2) \quad (5\text{-}1)$$

$$g_{\Delta y}^{-1}(x,y) = b_1(g_{\Delta x}(x,y) + G_x(i,j)) - (b_0 + G_y(i,j))(1.0 + a_1) \quad (5\text{-}2)$$

The representative point position correction amount calculation unit 60 may calculate the $g_x^{-1}(x, y)$ expressed by Formula (3-1) and the $g_y^{-1}(x, y)$ expressed by Formula (3-2) by using the calculated inverse transformation term $g_{\Delta x}^{-1}(x, y)$ inverse transformation term $g_{\Delta y}^{-1}(x, y)$, and coefficient k. Therefore, the representative point position correction amount calculation unit 60 calculates the inverse transformation term $g_{\Delta x}^{-1}(X_b, Y_b)$ and the inverse transformation term $g_{\Delta y}^{-1}(X_b, Y_b)$ at the position $C_b = (X_b, Y_b)$ of the representative point 40*a* of the pixel block 38*a* of interest and calculates the position correction amount ($g_x^{-1}(X_b, Y_b)$, $g_y^{-1}(X_b, Y_b)$) by using the result. In this manner, the position correction amount of the representative point 40*a* of the pixel block 38*a* of interest defined by the coordinate $C_b = (X_b, Y_b)$ can be obtained from the inverse transformation amount ($g_x^{-1}(X_b, Y_b)$, $g_y^{-1}(X_b, Y_b)$) of the correction function. Therefore, as illustrated in FIG. 7, the coordinate of the representative point 40*b* of the pixel block 38*b* which is the position after the correction of the representative point 40*a* of the pixel block 38*a* is obtained from the ($X_b + g_x^{-1}(X_b, Y_b)$, $Y_b + g_y^{-1}(X_b, Y_b)$) by using the coordinate ($X_b$, $Y_b$) of the representative point 40*a*.

The region of the lithography data which each pixel block is set as the processing object is distorted by the position deviation caused by the distortion of the reflecting surface of the mirror 210 and/or the distortion on the target object surface of the target object 101 which is set to as the lithography object. Generally, a change of distortion according to the position is sufficiently small. For this reason, the distortion of the region on the lithography data where the pixel block is set as the processing object can be expressed by linear transformation such as parallel translation, magnification reduction, rotation, and shearing at the position on the lithography data corresponding to the representative points of the pixel block. Therefore, with respect to the shape of the pixel block, the shape correction coefficient indicating the distortion of the position on the lithography data correspondence table the representative point of the pixel block is calculated.

As the pixel block shape calculating process (S122), the pixel block shape calculation unit 62 (second calculation unit) calculates the shape correction coefficient of the pixel block 38*b* by using a function where partial differential values of the correction function to the coefficients (or matrix elements) for every pixel block 42. More specifically, the following calculation is performed. The correction coefficient $\Delta g(x, y)$ for linearly correcting the distortion for every pixel block can be defined by the following Formula (6).

$$\Delta g(x, y) = \begin{pmatrix} 1.0 + g_x^{(x)}(x, y) & g_x^{(y)}(x, y) \\ g_y^{(x)}(x, y) & 1.0 + g_y^{(y)}(x, y) \end{pmatrix} \quad (6)$$

In addition, the partial differential values $g_x^{(x)}$, $g_x^{(y)}$, $g_y^{(x)}$, and $g_y^{(y)}$ used as the coefficients of Formula (6) are defined as partial differential values of the correction function with respect to x or y, and more specifically, are defined by the following Formulas (7-1), (7-2), (7-3), and (7-4).

$$g_x^{(x)}(x, y) = \frac{\partial g_x(x, y)}{\partial x} = a_1 + 2a_3x + a_4y + 3a_6x^2 + 2a_7xy + a_8y^2 \quad (7\text{-}1)$$

$$g_x^{(y)}(x, y) = \frac{\partial g_x(x, y)}{\partial y} = a_2 + a_4x + 2a_5y + a_7x^2 + 2a_8xy + 3a_9y^2 \quad (7\text{-}2)$$

$$g_y^{(x)}(x, y) = \frac{\partial g_y(x, y)}{\partial x} = b_1 + 2b_3x + b_4y + 3b_6x^2 + 2b_7xy + b_8y^2 \quad (7\text{-}3)$$

$$g_y^{(y)}(x, y) = \frac{\partial g_y(x, y)}{\partial y} = b_2 + b_4x + 2b_5y + b_7x^2 + 2b_8xy + 3b_9y^2 \quad (7\text{-}4)$$

As the determining process (S126), the determination unit 65 determines whether or not the processes for all the pixel blocks are ended. If there is a pixel block for which the processes are not ended, the procedure returns to the pixel block setting process (S108). Until the processes for all the pixel blocks are ended, the processes of from the pixel block setting process (S108) to the determining process (S126) are performed.

According to the configuration described heretofore, it is possible to acquire the coefficient for correcting the position and the shape of each pixel region 36 so that the position deviation caused by the distortion of the reflecting surface of the mirror 210 and/or the distortion on the target object surface of the target object 101 which is set to as the lithography object is corrected in unit of a pixel block. The pixel region 36 is a reference region for defining the beam irradiation time data. In the first embodiment, the area density and the like of the pattern are calculated by using each pixel region 36 before the correction, the beam irradiation time data are defined for each pixel region 36, and after that, instead of correcting the position of each pixel region, the position and the shape of each pixel region 36 itself which becomes a target object before the performing of the process are corrected.

As the pixel inside/outside determining process (S130), the determination unit 66 reads the lithography data from the storage device 140 and determines which one of the inside and the outside of each figure pattern the pixel region 36 is positioned in, with respect to each figure pattern defined in the lithography data for every pixel region 36.

Figure 8A:
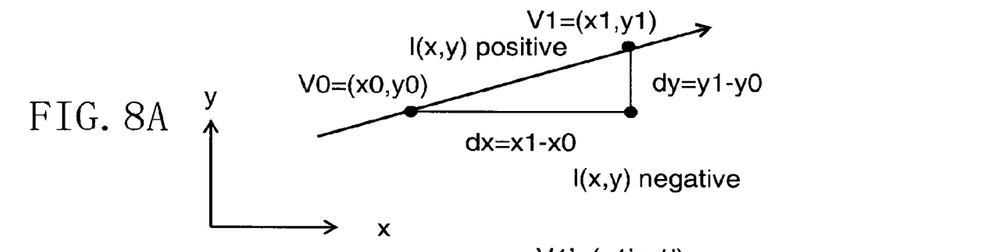
FIGS. 8A and 8B are diagrams for explaining an equation of straight line and a distance to the straight line according to the first embodiment.
Figure 8B:
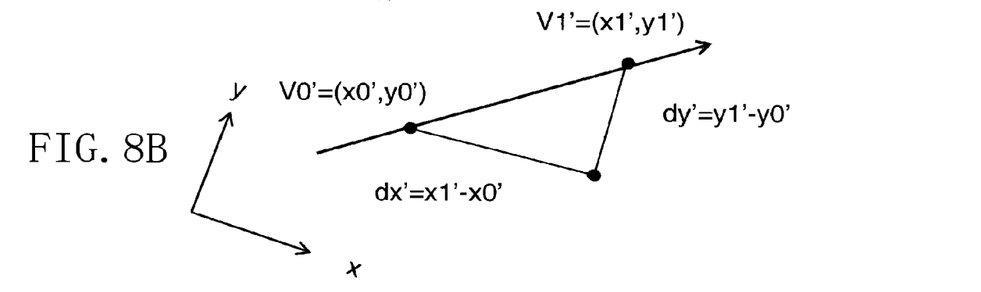

FIGS. 8A and 8B are diagrams for explaining the equation of straight line and the distance to the straight line according to the first embodiment. The equation of straight line l(x, y) is defined by l(x, y)=dy(x−x0)−dx(y−y0). The x-directional distance dx' and the y-directional distance dy' from the pixel region (for example, the pixel center) after the correction to the straight line corresponding to one side of the figure pattern illustrated in FIG. 8B are defined by the following Formula (8) using the x-directional distance dx and the y-directional distance dy from the pixel region (for example, the pixel center) to the straight line before the correction illustrated in FIG. 8A, the Formula (6), the representative points $C_b$ of the pixel block, and the relative position $\delta(C_b)$ of the pixel from the representative points of the pixel block, $$\begin{pmatrix} dx' \\ dy' \end{pmatrix} = \Delta g(C_b + \delta(C_b)) \begin{pmatrix} dx \\ dy \end{pmatrix} \quad (8)$$

The equation of straight line $L_b$ with respect to the relative position (x', y') of the target pixel viewed from the representative points of the pixel block after the correction is defined by the following Formula (9) using the equation of straight line $l_b$ with respect to the representative points of the pixel block after the correction.

$$L_b(x',y')=l_b-dx'\cdot y'+dy'\cdot x' \quad (9)$$

Herein, the equation of straight line $l_b$ with respect to the representative points of the pixel block is defined by the following Formula (10).

$$l_b=l(C_b+\delta^{-1}(C_b)) \quad (10)$$

In addition, the position $\delta^{-1}(C_b)$ of the calculation region viewed from the representative point of the pixel block is defined by the following Formula (11). Herein, the coordinate of the representative point $C_b$ of the pixel block is denoted by $(X_b, Y_b)$.

$$\delta^{-1}(C_b)=(g_x^{-1}(X_b,Y_b),g_y^{-1}(X_b,Y_b)) \quad (11)$$

If the Formula (9) has a positive value, it is determined that the straight line is inside the figure pattern. If the formula has a negative value, it is determined that the straight line is outside the figure pattern. The determination is performed for all the sides of the figure pattern. With respect to the figure pattern, if the Formula (9) has positive values for all the sides, the determination unit 66 determines that the pixel is positioned inside the figure pattern. The inside/outside determination result f for every pixel is stored in, for example, the storage device 142. The inside/outside determination result f is defined by "1" if the pixel is positioned inside one of the figure patterns and by "0" if the pixel is not positioned inside any one of figure patterns.

As the proximity effect correction dose coefficient $(D_p)$ calculating process (S132), the $D_p$ calculation unit 67 virtually divides the lithography region (herein, for example, the stripe region 35) into a plurality of the proximity mesh regions in a mesh shape with a predetermined size. It is very preferable that the size of the proximity mesh region is set to about 1/10 of the range of influence of the proximity effect, for example, about 1 μm. The correction dose coefficient $D_p(x)$ for correcting the proximity effect is calculated for every proximity mesh region. The correction model of the correction dose coefficient $D_p(x)$ and the calculation method thereof may be the same as those in the related art. The $D_p$ calculation unit 67 calculates the area density ρ', for example, for every proximity mesh region. The $D_p$ calculation unit 67 calculates unknown $D_p(x)$ satisfying the following Formula (12) by using a proximity effect correction coefficient η, a distribution function R(x), and a threshold value $D_{th}$. As the distribution function R(x), for example, a Gaussian distribution function is very preferably used. In addition, in Formula (12), x denotes the position of the proximity mesh.

$$\frac{D_p(x)}{2} + \eta \int \rho'(x')D_p(x')R(x-x')dx' = D_{th} \quad (12)$$

As the dose (D) calculating/beam irradiation time calculating process (S134), the dose (D) calculation unit 68 calculates the dose irradiated on the pixel region for every pixel region where the position deviation is corrected. More specifically, the dose (D) calculation unit 68 calculates the dose D(x, y) by multiplying the obtained correction dose coefficient $D_p(x+g_x^{-1}(x, y), y+g_y^{-1}(x, y))$, the inside/outside determination result f, and the base doses of the beam $D_0$ for every pixel region 36 where the position deviation is corrected. In this manner, it is very preferable that the dose D(x, y) is calculated in proportion to the area density of the pattern calculated for every pixel region 36 where the position deviation is corrected. The beam irradiation time (t) calculation unit 70 calculates the beam irradiation time t of the pixel region 36 by dividing the obtained dose D(x, y) by the current density J for every pixel region 36 where the position deviation is corrected. The beam irradiation time data obtained for every pixel region 36 where the position deviation is corrected are stored as shot data in the storage device 144 in the shot sequence.

As the lithographing process (S136), the lithography mechanism 150 writes (or "lithographs") (exposes) the pattern on the target object 101 by using the multiple beams 20 so that each pixel region 36 corresponds to the calculated dose. The lithographed (exposed) target object 101 is developed, and a resist pattern is formed. A mask substrate is formed by etching a light shielding film of the underlying layer by using the resist pattern as a mask.

Figure 9:
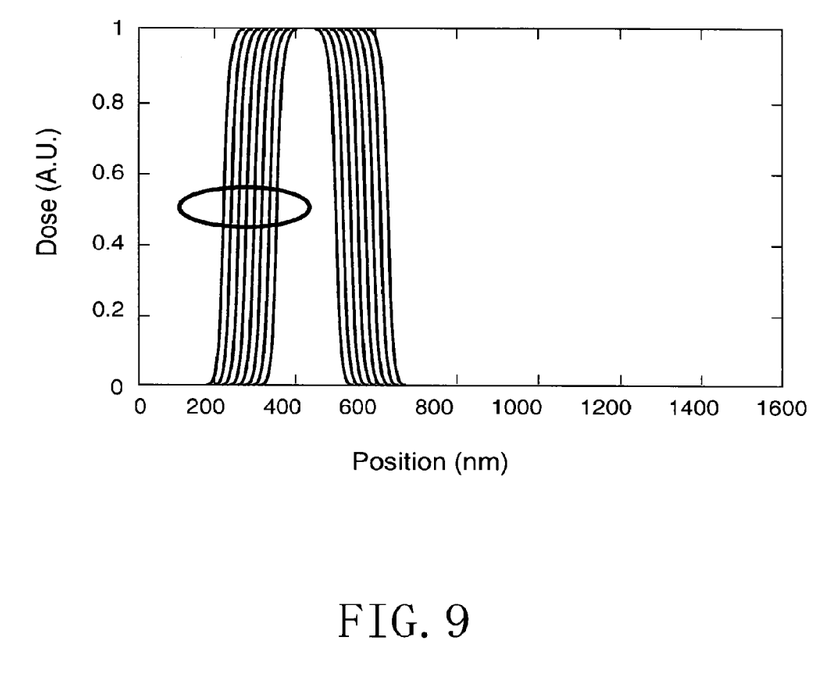
FIG. 9 is a diagram illustrating an example of a simulation result of a beam profile in case of lithographing a rectangle pattern rotated by 10° by using pixels on which position deviation correction is performed according to the first embodiment.

FIG. 9 is a diagram illustrating an example of a simulation result of a beam profile in case of lithographing a rectangle pattern rotated by 10° by using the pixels on which the position deviation correction is performed according to the first embodiment. In FIG. 9, illustrated is an example of the simulation result for the beam profile in case of lithographing the two inclined sides, which are inclined by 10° from the y axis by rotating the rectangular pattern by 10°, in the x direction at equal intervals toward the y direction. In the case of performing the lithographing in the x direction at equal intervals toward the y direction, all the line widths of the pattern at the positions in the y direction are the same in terms of design. In addition, the line widths are shifted at equal intervals in terms of design. As illustrated in FIG. 9, by using the pixels on which the position deviation correction according to the first embodiment is performed, it can be understood that each of the beam profiles having the same line width is shifted at equal interval.

Figure 10A:
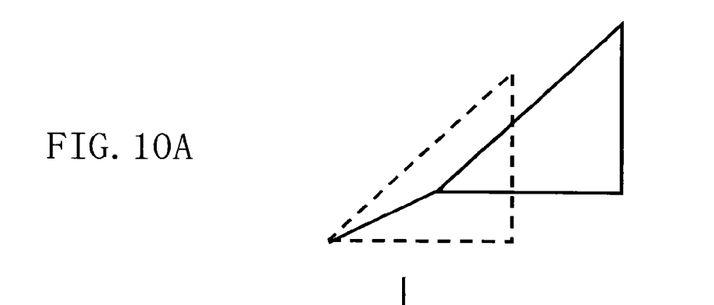
FIGS. 10A and 10B are diagrams illustrating examples of simulation results of cases of lithographing a triangle pattern in the cases where correction according to the first embodiment exists or does not exist.
Figure 10B:
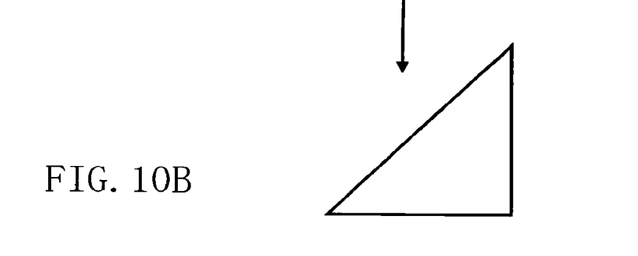

FIGS. 10A and 10B are diagrams illustrating examples of simulation results of the cases of lithographing a triangle pattern in the cases where the correction according to the first embodiment exists or does not exist. Herein, the case is considered where the position deviation occurs in two-dimensional directions without magnification, reduction, and rotation. FIG. 10A illustrates an example of the triangle pattern in the case where the lithographing is performed without performing the position deviation correction according to the first embodiment. This figure illustrates that, although the triangle pattern is to be formed at a position indicated by the dotted line in terms of design, the position is shifted to a position indicated by the solid line due to the position deviation. On the contrary, in case of lithographing by performing the position deviation correction according to the first embodiment, as illustrated in FIG. 10B, it can be understood that the position deviation is eliminated. In addition, FIG. 10B illustrates an example of the case where the correction is performed on the position of the center of the pixel block and the correction of magnification, reduction, and rotation is not performed.

Figure 11A:
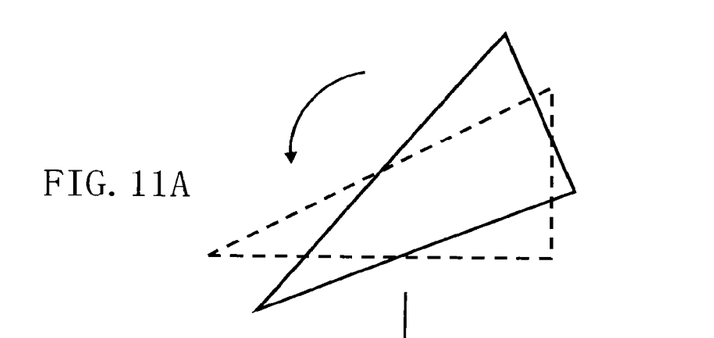
FIGS. 11A and 11B are diagrams illustrating other examples of simulation results of cases of lithographing a triangle pattern in the case where correction according to the first embodiment exists or does not exist.
Figure 11B:
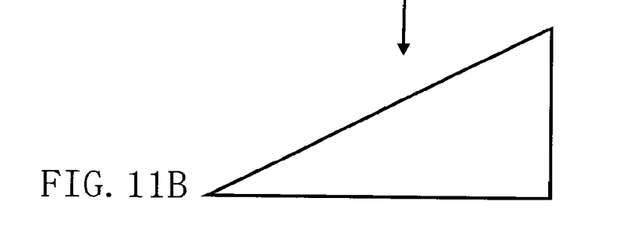

FIGS. 11A and 11B are diagrams illustrating other examples of simulation results of the cases of lithographing a triangle pattern in the case where the correction according to the first embodiment exists or does not exist. Herein, the case is considered where the position deviation caused by rotation occurs. FIG. 11A illustrates an example of the triangle pattern in the case where the lithographing is performed without performing the position deviation correction according to the first embodiment. This figure illustrates that, although the triangle pattern is to be formed at a position indicated by the dotted line in terms of design, the position is shifted to a position indicated by the solid line due to the position deviation according to rotation. On the contrary, in case of lithographing by performing the position deviation correction according to the first embodiment, as illustrated in FIG. 11B, it can be understood that the position deviation is eliminated. In addition, FIG. 11B illustrates an example of the case where the correction is performed on the position of the center of the pixel block and the correction of magnification, reduction, and rotation is performed.

Heretofore, according to the first embodiment, in the multiple beam lithography, it is possible to correction the position deviation caused by the distortion of the reflecting surface of the mirror 210 and/or the distortion of the target object 101 surface which is set as the lithography object. Therefore, it is possible to lithograph the pattern at highly-accurate positions with highly-accurate dimensions.

Heretofore, the embodiment was described with reference to the specific examples. However, the present invention is not limited to the specific examples.

While configurations of apparatuses, control methods, and the like which are directly needed for explanation of the present invention are omitted in description, the configurations of apparatus and the control methods can be appropriately selected to be used if necessary. For example, although a configuration of the control unit controlling the lithography apparatus 100 is omitted in description, it should be noted that the configuration of the control unit can be appropriately selected to be used if necessary.

In addition, all the charged particle beam lithography apparatuses and methods which include the subject matters of the present invention and can be appropriately changed in design by the skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam lithography apparatus comprising:
a dividing processing circuitry configured to divide a lithography region of a target object into a plurality of pixel regions having a mesh shape and being irradiated with multiple charged particle beams;
a group processing circuitry configured to group the plurality of pixel regions into a plurality of pixel blocks configured with at least one pixel region;
a correction processing circuitry configured to correct position deviation of a region on lithography data where a pixel block of interest is set as a processing object in units of a pixel block for each pixel block of the plurality of pixel blocks;
a dose calculating processing circuitry configured to calculate a dose being irradiated for each pixel region where the position deviation is corrected; and
a lithography mechanism including a charged particle beam source, a deflector, and a stage on which the target object is placed and configured to write a pattern on the target object by using the multiple charged particle beams so that each pixel region is illuminated with the calculated dose.

2. The multiple charged particle beam lithography apparatus according to claim 1, wherein the correction processing circuitry corrects a position of a representative point of the pixel block for each pixel block by using an inverse transformation amount of a correction function of correcting position deviation at the representative point of the pixel block.

3. The multiple charged particle beam lithography apparatus according to claim 2, wherein the correction processing circuitry includes a first calculating processing circuitry configured to calculate an inverse transformation term used for an inverse transformation process for the correction function for each pixel block.

4. The multiple charged particle beam lithography apparatus according to claim 3, wherein the correction processing circuitry further includes a second calculating processing circuitry configured to calculate a correction amount of each position specifying a shape of the pixel block by using a function using partial differential values of the correction function to coefficients for each pixel block.

5. The multiple charged particle beam lithography apparatus according to claim 1, further comprising:
   an acquisition processing circuitry configured to acquire a position deviation amount of a pattern to be written of each position inside the pixel block; and
   a fitting processing circuitry configured to fit a correction amount used for correcting the position deviation of each position inside the pixel block to the correction function.

6. The multiple charged particle beam lithography apparatus according to claim 5, further comprising a correction map generating processing circuitry configured to generate a correction map of defining a correction amount of correcting uneven position deviation being able not to be corrected by the correction function.

7. A multiple charged particle beam lithography method comprising:
   dividing a lithography region of a target object into a plurality of pixel regions having a mesh shape and being irradiated with multiple charged particle beams;
   grouping the plurality of pixel regions into a plurality of pixel blocks configured with at least one pixel region;
   correcting position deviation of a region on lithography data where a pixel block of interest is set as a processing object in units of a pixel block for each pixel block of the plurality of pixel blocks;
   calculating a dose being irradiated for each pixel region where the position deviation is corrected; and
   writing a pattern on the target object by using the multiple charged particle beams so that each pixel region is illuminated with the calculated dose.

8. The multiple charged particle beam lithography method according to claim 7, further comprising writing an evaluation pattern on an evaluation substrate.

9. The multiple charged particle beam lithography method according to claim 8, further comprising:
   measuring a plurality of positions of the evaluation pattern written on the evaluation substrate; and
   calculating position deviation amounts of the measured positions corresponding to design positions of the evaluation pattern and storing the position deviation amounts in a storage device.

10. The multiple charged particle beam lithography method according to claim 9, further comprising reading position deviation amount data stored in the storage device and acquiring the position deviation amounts of the positions inside the pixel block.

\* \* \* \* \*